(12) United States Patent
Neidengard

(10) Patent No.: US 7,679,404 B2
(45) Date of Patent: Mar. 16, 2010

(54) MISSING CLOCK PULSE DETECTOR

(75) Inventor: Mark L. Neidengard, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/474,025

(22) Filed: Jun. 23, 2006

(65) Prior Publication Data

US 2007/0296467 A1 Dec. 27, 2007

(51) Int. Cl.
*H03K 5/19* (2006.01)
(52) U.S. Cl. .......................... 327/18; 327/20
(58) Field of Classification Search ............ 327/18, 327/20
See application file for complete search history.

(56) References Cited

U.S. PATENT DOCUMENTS

| | | | | |
|---|---|---|---|---|
| 5,642,069 | A * | 6/1997 | Waite | 327/292 |
| 6,163,172 | A * | 12/2000 | Bazuin et al. | 326/93 |
| 6,545,508 | B2 * | 4/2003 | Senba | 327/20 |
| 7,049,865 | B2 | 5/2006 | Parker | |
| 7,106,116 | B2 * | 9/2006 | Yamada | 327/175 |
| 7,405,631 | B2 | 7/2008 | Neidengard | |
| 2007/0075753 | A1 | 4/2007 | Parker | |
| 2008/0258782 | A1 | 10/2008 | Neidengard | |

OTHER PUBLICATIONS

Restle, P.J. et al., "Timing Uncertainty Measurements on the Power5 Microprocessor", *ISSCC* (2004).

\* cited by examiner

*Primary Examiner*—Lincoln Donovan
*Assistant Examiner*—Ryan C Jager
(74) *Attorney, Agent, or Firm*—Erik R. Nordstrom

(57) ABSTRACT

A method to detect a missing a clock pulse is provided. The method begins by providing a clock signal and a delayed clock signal. The delayed clock signal is then sampled to generate a sample of the delayed clock signal. A missing clock pulse may be detected if the sample of the delayed clock signal does not equal an expected value of the delayed clock signal.

8 Claims, 5 Drawing Sheets

MISSING CLOCK PULSE DETECTOR

BACKGROUND

Microelectronic circuits typically include digital components that operate in synchrony. In such systems, clocks may be used to synchronize events and control the timing of most operations. A clock generates a series of sequential square wave pulse signals that transition from a low state (i.e., logical "0") to a high state (i.e., logical "1"). The series of pulses, also referred to as a clock waveform, is transmitted by the clock to each of the circuit components.

In a complex microelectronic system, clock waveforms may be affected by a variety of conditions that cause error, such as jitter, skew, noise, and the disappearance of clock pulses. The missing clock pulses may be detected by capturing portions of the clock waveform by using a serial data analyzer such as a storage oscilloscope, and then testing the portions for the missing clock pulses. If it is determined that a clock pulse is missing in that captured block, the oscilloscope may retain the block and ignore a subsequent block.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

In the following detailed description, numerous specific details are described in order to provide a thorough understanding of the invention. However the present invention may be practiced without these specific details. In other instances, well known methods, procedures, components and circuits have not been described in detail so as not to obscure the present invention. Further, example sizes/models/values/ranges may be given, although the present invention is not limited to these specific examples.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
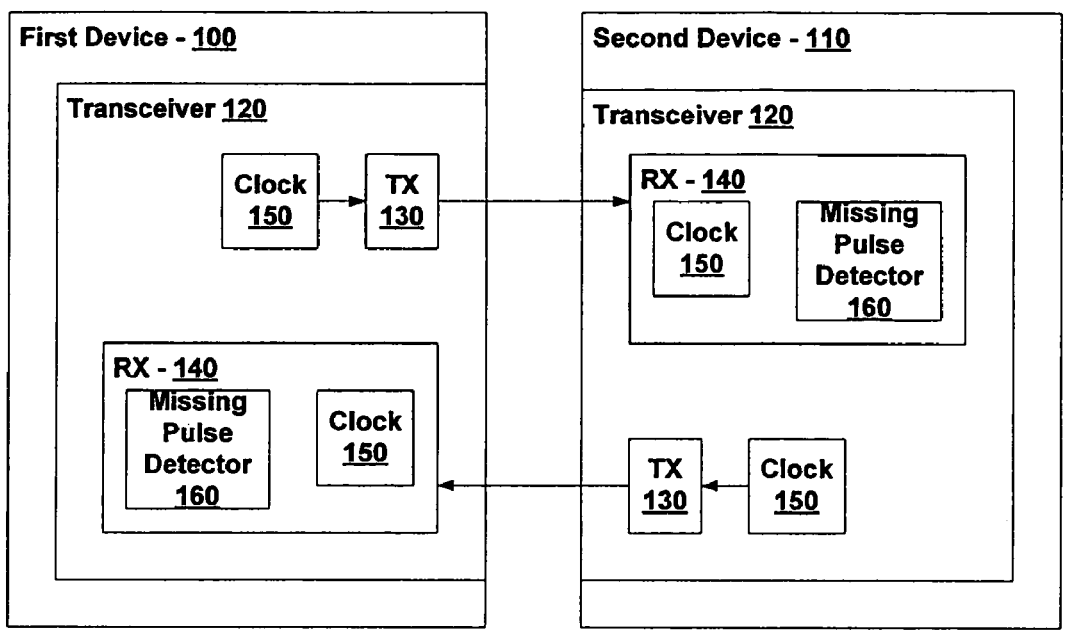
FIG. 1 illustrates an embodiment of a transmission system.

Referring to FIG. 1, an embodiment of a transmission system comprising a plurality of devices 100, 110 is shown. The devices 100, 110 may for example comprise computer systems, I/O devices, chipsets, microprocessors and/or a combination of said devices. As depicted, each device 100, 110 may comprise a transceiver 120 to serially send and receive data signals. The transceiver 120 may comprise a transmitter 130, a receiver 140, and a clock 150. The transceiver may also comprise a missing clock pulse detector 160 to detect whether the clock pulse transmitted by the clock 150 has any missing pulses. The clock 150 may generate a clock signal to drive the transmitter 130, which may transmit a plurality of data bits synchronously with the clock signal.

The clock 150 of the receiver 140 may generate a clock signal based upon the data signal received from a transmitter 130, and the receiver 140 may capture data signal based upon the clock signal provided by the receiver clock 150. The missing clock pulse detector 160 of the receiver 140 may detect the missing clock pulses of the clock signals generated by the clock 150 of the receiver 140.

Figure 2:
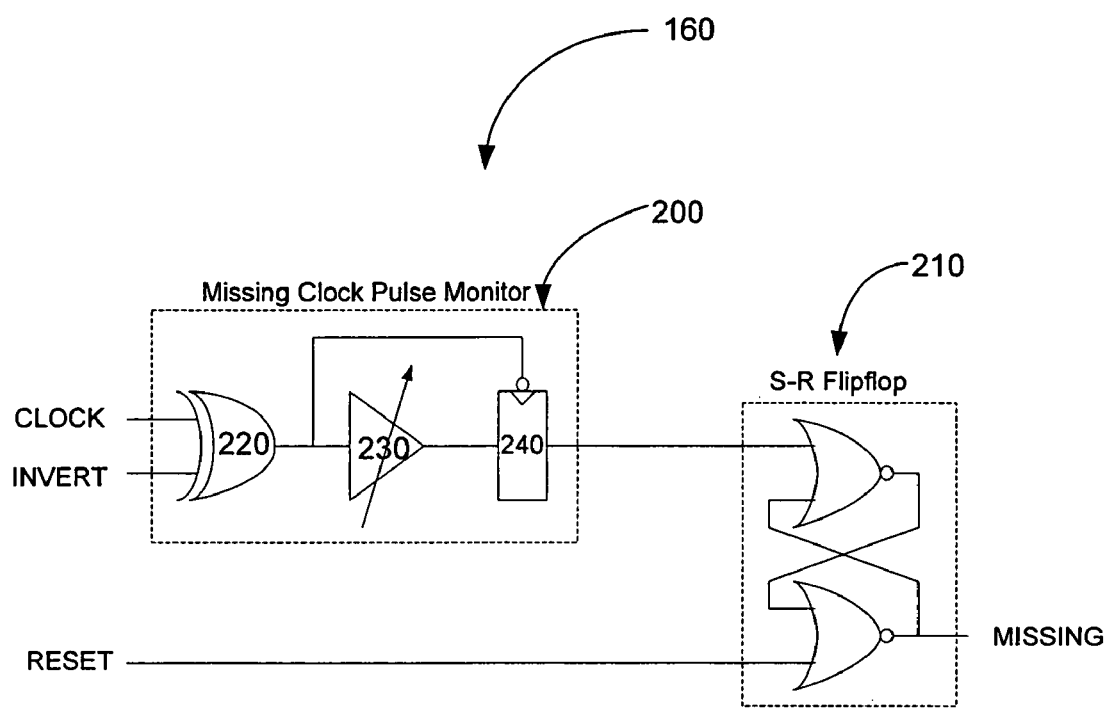
FIG. 2 illustrates an embodiment of a consecutive edge detector depicted in FIG. 1.

Referring now to FIG. 2, an embodiment of the missing clock pulse detector 160 is illustrated. The missing clock pulse detector 160 may comprise a missing clock pulse monitor 200 coupled to a flip-flop, such as a set-reset (S-R) flip-flop 210. The missing clock pulse monitor 200 may comprise conditional inverter, such as a logic gate 220 having a clock signal input. The logic gate 220 may be coupled to a delay line 230, which may be used to generate a delayed clock signal. The delay line 230 may be coupled to a latch 240. The conditional inverter 220 may also be coupled with the latch 240, which may in turn be coupled to the flip-flop 210. In one embodiment, the latch 240 may be a negative edge-triggered latch and may have a first input to receive the clock signal and a second input to receive the delayed clock signal.

The conditional inverter 220 may comprise an XOR (exclusive OR) gate to receive the clock signal and to generate either the clock signal or an inverted clock signal. In one embodiment the conditional inverter 220 may transmit the clock signal to the latch 240 directly and the delayed clock cycle signal may be transmitted to the latch through the delay line 230. Because in this particular embodiment, the first input of the latch is a negative edge triggered input, if a missing signal is generated, it will be indicative of a missing low clock pulse. In other embodiments, the second input may be the edge triggered latch input.

Figure 3:
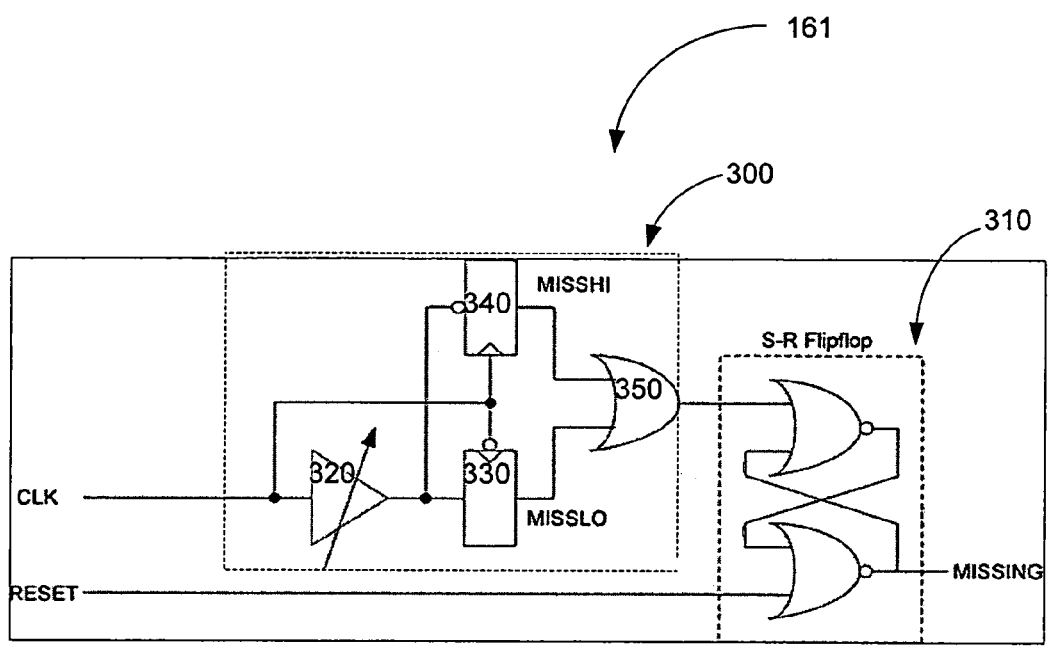
FIG. 3 illustrates another embodiment of the consecutive edge detector.

Referring now to FIG. 3, another embodiment of the missing clock pulse detector 161 is illustrated. The missing clock pulse detector 161 may comprise a missing clock pulse monitor 300 coupled to a flip-flop, such as a S-R flip-flop 310. The missing clock pulse monitor 300 may comprise a delay line 320 to receive a clock signal and to generate delayed clock signal. The delay line 320 may be coupled to a pair of latches, for example, a first latch or a negative edge triggered latch 330 and a second latch or positive edge triggered latch 340.

The latches 330 and 340 may be coupled to a logic gate, for example an OR gate 350, which may receive missing clock pulse signals from both the latches 330 and 340. If the OR gate 350 receives a missing clock pulse signal from either the latch 330 or the latch 340, it will generate a missing clock pulse signal as well. The logic gate 350 may be coupled to a flip-flop, such as a S-R flip-flop, 310. The flip-flop 310 may receive the missing signal from the logic gate 350 and generate a sticky missing signal, which may be continually asserted until the S-R flip flop 310 is reset.

In one embodiment, the clock signal may be provided to the negative edge triggered input of latch 330 and the positive edge triggered input of latch 340, while the delayed clock signal may be provided to the data input of latches 330 and 340 through the delay line 320. If the clock signal has a missing low pulse, latch 330, which will generate a misslo signal. If the clock signal has a missing high pulse, latch 340 will generate a misshi signal. Accordingly, the misslo signal would be indicative of a missing low clock pulse and the misshi signal would be indicative of a missing high clock pulse.

Figure 4A:
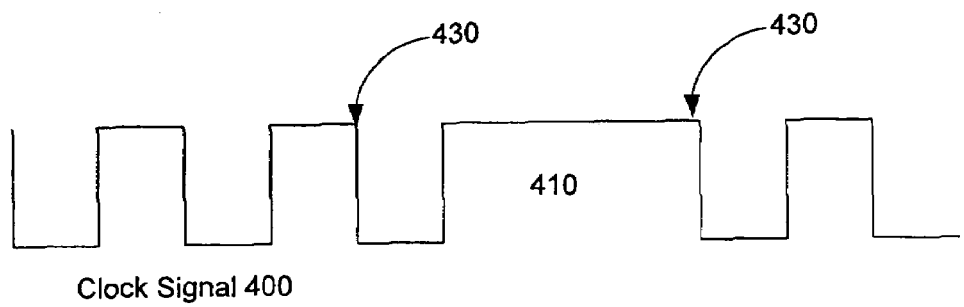
FIG. 4A illustrates a normal clock cycle having a missing low clock pulse.

Referring now to FIG. 4A, a clock signal 400 having a missing low pulse 410 is shown. In the embodiment of the present invention described in FIG. 2, the clock signal may be provided to the data input of the conditional inverter 220 of the missing clock pulse monitor 200. To detect the missing low pulse 410, the invert input of the conditional inverter 220 may be set low (zero). A delayed clock signal may be generated by inputting the clock signal into the delay line 230.

Figure 4B:
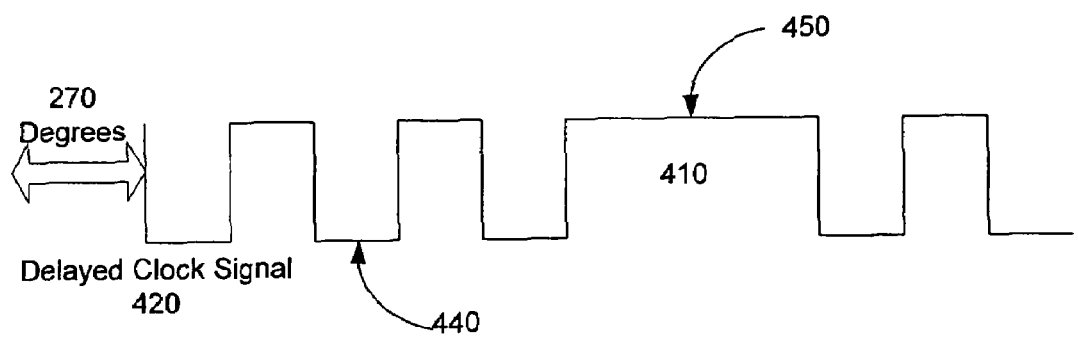
FIG. 4B illustrates a delayed clock cycle having a missing low clock pulse.

In one embodiment, as shown in FIG. 4B, a delayed clock signal 420 may have a delay of between about 180 degrees to about 360 degrees, for example, 270 degrees. Both the clock signal 400 and the delayed clock signal 420 may then be input to the latch 240. In one embodiment the clock signal 400 may be input to the negative edge triggered input of latch 240, which will be triggered during the falling edge 430 of the clock signal 400.

When the latch 240 is triggered, data from the delayed clock signal 420 is latched. Thus, the latch 240 may start sampling the delayed clock signal during the falling edge of the clock signal. If the low pulse of the delayed clock signal is present as expected with a delay of 270 degrees, then the sample 440 of the delayed clock signal will be low. However, if the low pulse is missing, then the sample 450 of the delayed clock signal will be high. Thus, if the clock signal 400 and the delayed clock signal 420 have a missing low pulse, the latch 240 will generate a high (one) missing signal output. The missing signal may then be transmitted to the flip-flop 210, which will then generate a sticky missing signal. The flip-flop 210 may be used to hold the sticky missing signal until a reset clears the flip-flop 210.

In another embodiment of the present invention, the same method may be used to detect a missing high pulse in the clock signal by inverting the clock signal with the conditional inverter 220. When the inverted clock signal is input to the latch 240, the negative edge triggered input is triggered by a rising edge of the clock signal and a missing high pulse may be detected. In yet another embodiment of the present invention, such as the embodiment described in FIG. 3, two latches 330 and 340 may be used in parallel to detect low and high missing clock pulses simultaneously.

Figure 5:
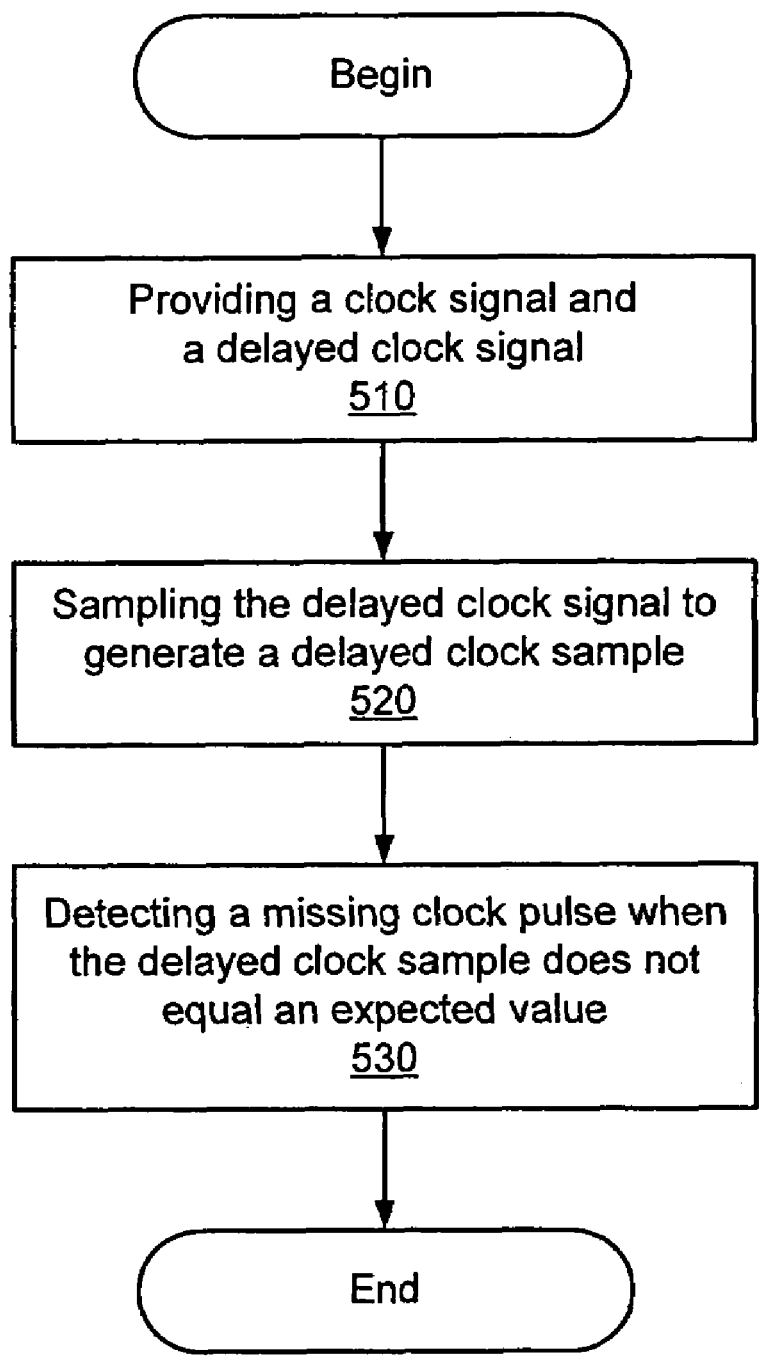
FIG. 5 illustrates an embodiment of the process that may be implemented by the system of FIG. 1.

Reference is now made to FIG. 5 which depicts a method in accordance with one embodiment of the present invention. As depicted in block 510, a clock signal and a delayed clock signal are provided. In one embodiment, the clock signal may be provided to the data input of a conditional inverter. The invert terminal of the logic gate may be set either at low or high to detect either a low missing clock pulse or high missing clock pulse. The delayed clock signal may be provided by a delay line. In one embodiment, the delay line may be set at between about 180 degrees to about 360 degrees.

If the conditional inverter is off, a negative edge triggered latch may be used to sample the delayed clock signal in a block 520. The sampling may occur on the falling edge of the clock signal to detect whether a low clock pulse is missing. If the conditional inverter is on, an inverted clock signal will be input to the delay line and the latch, enabling the present invention to detect missing high clock pulses. Alternatively in another embodiment, the present invention may use two latches in parallel to detect both types of missing clock pulses.

In a block 530, if the sample of the delayed clock signal does not equal an expected value, then a missing clock pulse is detected and a missing signal is generated by the appropriate latch. In one embodiment, a S-R flip-flop may be used to hold the value of the missing signal.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A missing pulse detector comprising:
   a delay line having an input for receiving a clock signal, wherein the delay line is to generate a delayed clock signal;
   a latch having a first input to receive the clock signal and a second input coupled to the delay line, wherein the latch is to generate a missing signal if the delayed clock signal does not equal an expected value of the delayed signal, the missing signal to be generated in response to a missing clock pulse, wherein the second input is an edge triggered latch input; and
   a conditional inverter having an output coupled to the delay line and the latch, wherein the conditional inverter is to receive the clock signal and generate one of a group consisting of the clock signal and an inverted clock signal.

2. The missing pulse detector of claim 1, wherein the first input is a negative edge triggered latch input and wherein the missing signal is indicative of a missing low clock pulse.

3. The missing pulse detector of claim 1, wherein the conditional inverter generates the inverted signal and wherein the missing signal is indicative of a missing high clock pulse.

4. The missing pulse detector of claim 1, further comprising a set-reset flip flop coupled to the latch, wherein the set-reset flip flop is receive the missing signal and to generate a sticky missing signal.

5. The missing pulse detector of claim 1, wherein the expected value is generated by an ideal delayed clock signal.

6. A missing pulse detector comprising:
   a delay line having an input for receiving a clock signal, wherein the delay line is to generate a delayed clock signal;
   a first latch having a first input to receive the clock signal and a second input coupled to the delay line, wherein the first latch is to generate a first missing signal if the delayed clock signal does not equal a first expected value of the delayed signal;
   a second latch having a first input coupled to the delay line and a second input coupled to the clock signal, wherein the second latch is to generate a second missing signal if the delayed clock signal does not equal a second expected value of the delayed signal, the first and second latches to detect a missing clock pulse, wherein the first input of the first latch comprises a negative edge triggered latch input and wherein the first missing signal is indicative of a missing low clock pulse, the second input of the second latch comprising a positive edge triggered latch input and wherein the second missing signal is indicative of a missing high clock pulse;

a logic gate coupled to the first latch and the second latch, wherein the logic gate is to receive at least one of the first missing signal and the second missing signal to generate a third missing signal; and a set-reset flip flop coupled to the logic gate, wherein the set-reset flip flop is to receive the third missing signal and to generate a sticky missing signal.

7. The missing pulse detector of claim 6 wherein the expected value based on an ideal delayed clock signal.

8. The missing pulse detector of claim 6 wherein the logic gate is an OR gate.

* * * * *